United States Patent [19]

Neilson

[11] Patent Number: 5,382,825
[45] Date of Patent: Jan. 17, 1995

[54] SPIRAL EDGE PASSIVATION STRUCTURE FOR SEMICONDUCTOR DEVICES

[75] Inventor: John M. S. Neilson, Norristown, Pa.

[73] Assignee: Harris Corporation, Melbourne, Fla.

[21] Appl. No.: 1,752

[22] Filed: Jan. 7, 1993

[51] Int. Cl.[6] .................... H01L 23/58; H01L 29/74; H01L 29/76; H01L 29/00

[52] U.S. Cl. .................................. 257/489; 257/170; 257/339; 257/491; 257/538

[58] Field of Search ............... 257/170, 337, 339, 341, 257/487, 488, 489, 490, 491, 494, 495, 536, 537, 538, 379, 380, 577

[56] References Cited

U.S. PATENT DOCUMENTS

| 3,890,698 | 6/1975 | Clark | 257/489 |
| 4,157,563 | 6/1979 | Bosselaar | 257/489 |
| 4,947,232 | 8/1990 | Ashida | 257/489 |

FOREIGN PATENT DOCUMENTS

| 0115093 | 8/1984 | European Pat. Off. | 257/489 |
| 0190423 | 8/1986 | European Pat. Off. | 257/489 |
| 0576001 | 12/1993 | European Pat. Off. | 257/489 |
| 59-161066 | 9/1984 | Japan | 257/489 |
| 4-332173 | 11/1992 | Japan | 257/489 |
| WO83/01709 | 5/1983 | WIPO | 257/489 |

OTHER PUBLICATIONS

Macary, et al., Comparison between Biased and Floating Guard Rings used as Junction Termination Technique, Proceedings of 1992 International Symposium on Power Semiconductor Devices & ICs, Tokyo, pp. 230–233.

Semiconductor Power Devices-Physics of Operation and Fabrication Technology, Ghandhi, pp. 56–73.

*Primary Examiner*—Steven Ho Yin Loke
*Attorney, Agent, or Firm*—Rogers & Killeen

[57] ABSTRACT

Semicondctor devices having a curved P-N junction in an active area of the device and an edge passivation region extending from the active area to an edge region of the device include an electrically resistive ribbon that spirals outwardly from the active area to the edge of the device so that a voltage difference between the active area and the edge region is spread along the length of the ribbon. The ribbon may take the form of a linear resistor or may include plural diodes. The distance between radially overlapping portions of the spiralling ribbon and the cross-sectional area of the ribbon may be varied to spread the equipotential lines in the device so as to reduce the effect of the curved P-N junctions on the breakdown voltage of the device.

29 Claims, 4 Drawing Sheets

SPIRAL EDGE PASSIVATION STRUCTURE FOR SEMICONDUCTOR DEVICES

BACKGROUND OF THE INVENTION

The present invention relates to semiconductor devices and, more particularly, to the novel use of an elongated, relatively narrow ribbon of resistive material in an edge passivation structure of a semiconductor device for increasing the breakdown voltage of the device.

The maximum reverse voltage that a semiconductor device having a P-N junction can withstand is limited by the breakdown voltage of the junction. The actual breakdown voltage of the junction normally falls short of the theoretical breakdown voltage because excessively strong electric fields are present at certain locations in the device under reverse bias. One of the locations most susceptible to formation of excessively strong electric fields is in the perimeter of the device where the P-N junction terminates. In this region a transition is made from an electric field supported within the semiconductor material to an electric field supported within the surrounding dielectric material. Further discussion of this phenomenon may be found in *Semiconductor Power Devices* by S. K. Ghandhi beginning at page 56.

High voltage semiconductor devices may include an edge passivation structure to reduce the intensity of the electric fields associated with P-N junction termination. The edge passivation structure provides an area for transition from the high electric potential gradient in the active area of the device to the different electric potential gradient at the edge of the device. The edge passivation structure reduces field intensity by spreading the equipotential lines across the edge passivation region, thereby reducing the crowding of the equipotential lines (i.e., reducing the voltage gradient). The transition from the one potential gradient in the active area to the other potential gradient at the edge of the device is desirably made without introducing excess current leakage and without trapping surface charges that may crowd the equipotential lines and cause localized avalanching or induce channel leakages in the underlying silicon.

Various edge passivation structures are known in the art, including beveled edges, depletion-etched edges, graded-density depletable regions, conductive field plates, resistive field plates, conductive top-surface equipotential rings, diffused equipotential rings, subsurface equipotential rings, etc. depending, at least in part, on the voltage of the device.

For example, devices operable up to about 600 volts may use diffused equipotential rings with graded spaces between the rings such as shown in FIG. 1. In such devices, the edge passivation region 10 between the active area 12 and edge region 14 of the device may include annular guard rings 16 that are diffused into the body of the device. A layer of silicon dioxide 20 may be deposited on top of the body followed by an insulative layer such as phosphorous silicon glass 22 followed by an appropriate overcoat 24. The annular guard rings 16 each have a different potential that varies from the potential in the active region 12 to that of the edge region 14.

Because the present invention relates to a variety of semiconductor devices in which edge passivation is desirable, the device of FIG. 1 and all subsequent devices are depicted and discussed without reference to the structure of the device below the P-N junction. It is understood by those skilled in the art that the present invention is applicable to many different types of devices having many different types of structures below (or above) the P-N junction.

As may be seen in FIG. 1, the equipotential lines in the region 26 adjacent the curved portion 28 of the P-N junction 30 are spread into the passivation region 10 by the annular rings 16, instead of following the contour of the curved portion 28 of the junction 30 and crowding together at the surface of the device.

In the absence of extraneous surface charges, such a structure may be adequate for some applications. However, in the presence of surface charges the equipotential lines become crowded at one end or the other (depending on the polarity of the charges) causing high surface fields and surface leakage due to localized unstable avalanche breakdown in the high field regions near the surface. Another disadvantage of such diffused edge passivation structures is that they use a lot of chip surface area. The minimum space between diffused rings is approximately equal to the minimum line width capability of the photomask operation plus approximately twice the diffusion depth. To compound this problem, the ring-to-ring voltage is not firmly fixed so that extra rings and extra space must be included to allow for variations.

Another known structure which is less influenced by surface charges is the resistive field plate illustrated in FIG. 2. In this structure, a plate 32 of resistive material extends between the active area 12 and the edge region 14 of the device. The voltage difference between the active area and the edge region is spread out linearly across the field plate 32. The field inside the body of the device is forced to spread out over the same distance as in the overlying field plate thereby spreading the equipotential lines in a fashion similar to that shown in FIG. 1. The body is shielded from charges outside the plate so as to reduce the influence of the surface charges. While this is an effective means of edge passivation, it is not commonly used because the resistive layer 32 must have a very high sheet resistivity, on the order of gigohms per square, in order to avoid excessive leakage through the layer 32. Such high resistivity layers are difficult to construct using the materials and processes commonly employed in the manufacture of semiconductor devices.

Another known edge passivation structure includes annular equipotential rings 34 such as illustrated in FIG. 3. The rings are connected by resistors or diodes (not shown) to force voltage to be distributed uniformly from ring-to-ring across the edge passivation area 10. Because the potential of each of the rings is set by the resistors (or diodes), the voltage in the body beneath the rings is also forced to spread out across the passivation area independently of any surface charges. As the potential of each of the rings is set, their resistivity is not critical (in contrast to the resistive field plate in FIG. 2) so that the materials for the rings may be selected from those commonly used in the fabrication of semiconductor devices, such as metal or polysilicon. As is apparent, however, the rings must be connected by resistors or diodes that are added in potentially costly and extra fabrication steps.

Accordingly, it is an object of the present invention to provide a novel structure for an edge passivation region that obviates the above described problems of the prior art.

It is another object of the present invention to provide a novel structure for an edge passivation region for a semiconductor device in which the electrical potential difference between the active area and the edge region of the device is spread along an electrically resistive ribbon that spirals around the active area.

It is yet another object of the present invention to provide a novel structure for an edge passivation region for a semiconductor device in which the electrical potential difference between the active area and the edge region of the device is spread along an electrically resistive ribbon that is diffused into the semiconductor material and spirals around the active area.

It is still another object of the present invention to provide a novel structure for an edge passivation region for a semiconductor device in which the electrical potential difference between the active area and the edge region of the device is spread along an electrically resistive ribbon that is deposited on top of the semiconductor material and spirals around the active area.

It is a further object of the present invention to provide a novel structure for an edge passivation region of a semiconductor device in which the current flow between the active area and the edge of the device is at an angle from directly radial.

These and many other objects and advantages of the present invention will be readily apparent to one skilled in the art to which the invention pertains from a perusal of the claims, the appended drawings, and the following detailed description of preferred embodiments.

DETAILED DESCRIPTION OF PREFERRED EMBODIMENTS

Figure 1:
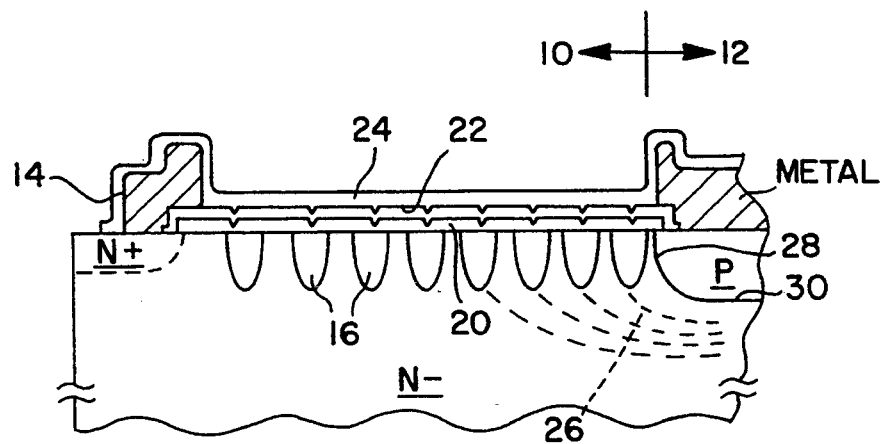
FIG. 1 is partial pictorial representation of a vertical cross-section of an edge passivation region of the prior art illustrating diffused annular guard rings.
Figure 2:
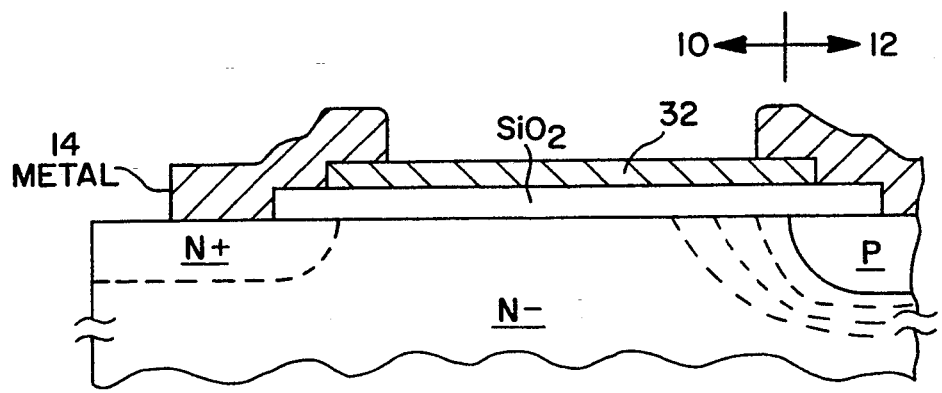
FIG. 2 is a partial pictorial representation of a vertical cross-section of an edge passivation region of the prior art illustrating a resistive field plate.
Figure 3:
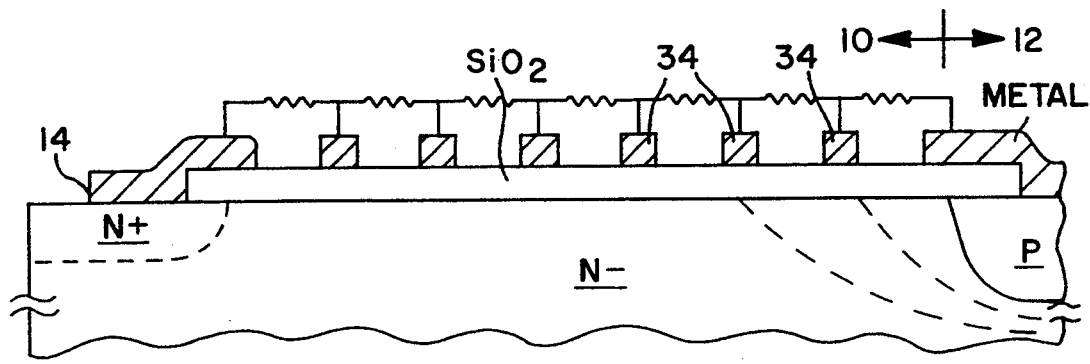
FIG. 3 is a partial pictorial representation of a vertical cross-section of an edge passivation region of the prior art illustrating the resistively connected annular rings.
Figure 4:
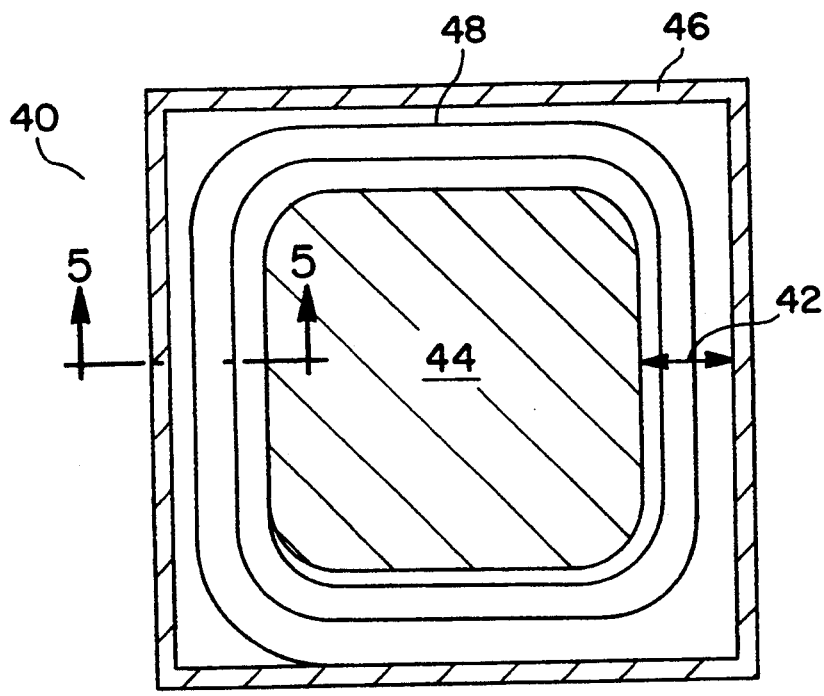
FIG. 4 is a pictorial representation of an overhead plan view of a surface of a semiconductor device embodying the present invention.
Figure 5A:
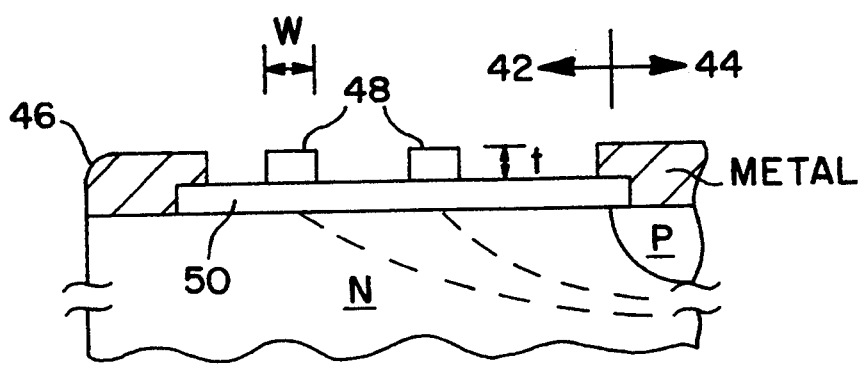
FIG. 5a–5d are pictorial representations in vertical cross-section on of several embodiments of the present invention that may be appear at line 5—5 of FIG. 4.
Figure 5B:
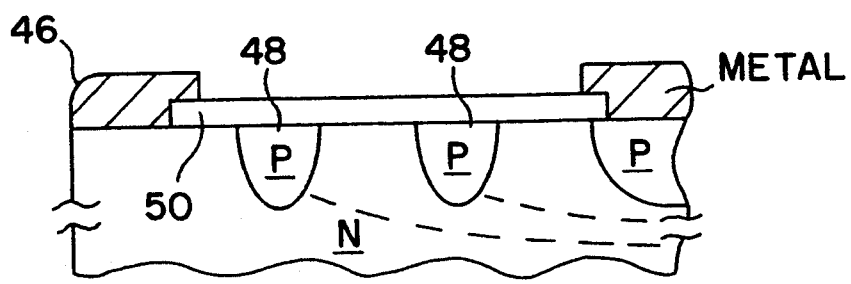

With reference now to FIGS. 4 and 5a–5b, a semiconductor device 40 incorporating the present invention may include an edge passivation region 42 that lies between the active area 44 of the device and the edge portion 46 of the device, wherein the edge passivation region 42 includes an elongated, relatively narrow ribbon 48 of a resistive material that extends from the active area 44 to the edge portion 46. As may be seen in FIG. 5a, the ribbon 48 may be deposited on an insulative layer 50, or as seen in FIG. 5b the ribbon 48 may be a region of opposite conductivity formed in the body of the device.

In contrast to the prior art, the ribbon 48 spirals around the active area 44. The term "spiral" as used herein means to extend more than completely around a central area without contacting a radially overlapping portion. That is, the ribbon has a length in polar coordinates that exceeds 360°.

The ribbon of resistive material can have a much lower resistivity than the edge passivation material of the prior art but, primarily because of its length, still provide the high resistance necessary for good edge passivation with low current leakage. The resistivity required for this structure is obtainable using known semiconductor manufacturing materials and processes. For example, the ribbon 48 of resistive material illustrated in FIG. 5a may be metal, polysilicon, single crystal silicon or other electrically resistive materials suitable for semiconductor devices. The ribbon 48 of resistive material illustrated in FIG. 5b may be formed by implanting or diffusing the appropriate dopant into the body of the device. The ribbon 48 may be implanted and/or diffused to a depth that is desirably equal to the depth of the P-N junction.

The present invention may be more clearly understood by explaining the relationship of the resistance R of the ribbon to its structure. As is known:

$$R = \rho L/A \qquad (1)$$

where $\rho$ is the resistivity of the ribbon material, L is the length of the ribbon and A is the cross-sectional area of the ribbon (where $A = W \times t$ as illustrated in FIG. 5a).

The sheet resistivity $\rho_s$ of the ribbon material is $\rho/t$. Therefore:

$$R = P_s L/W \qquad (2)$$

In the prior art, L was no longer than the radial distance from the active area to the edge region. Thus, $\rho_s$ and W had to be varied to achieve the desired resistance.

In the present invention, L and W may be tailored (with L being large and W small) so as to be consistent with available sheet resistivities.

The width and thickness (or, more generally, the cross-sectional area) of each of the ribbons may be varied to adjust the resistance of a portion of the ribbon. Further, the spacing of each of the loops in the spiral ribbon may be adjusted so that the equipotential lines are appropriately spread in the passivation region of the body of the device. The cross-sectional area may vary as a function of distance from the active area. As the thickness of the ribbon is likely to be set by the fabrication process, width and spacing may be the operative variables.

Figure 5C:
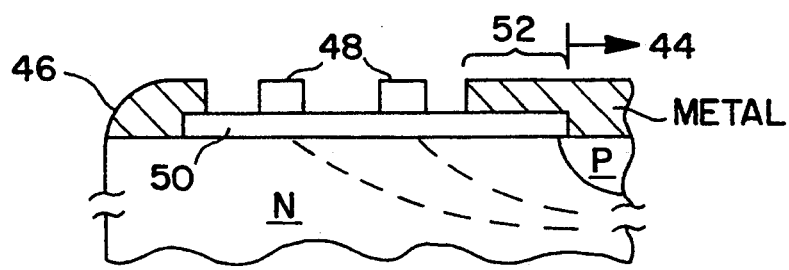

With reference now to FIG. 5c, the present invention may also include a conductive field plate 52 to equalize the potential at the perimeter of the active area 44. The conductive field plate 52 may surround the active area 44 and extend to a width that exceeds the depth of the P-N junction in the active area (desirably at least three times the junction depth). This structure has an effect similar to that of a shallow junction extending beyond the actual junction that reduces the curvature of the equipotential lines and increases breakdown voltage. The spiral ribbon 48 may be deposited as shown or in the body of the device (not shown). The conductive field plate 52 may be an extension of the active region metal or formed separately of other material, such as when the spiral ribbon 48 is deposited.

Figure 5D:
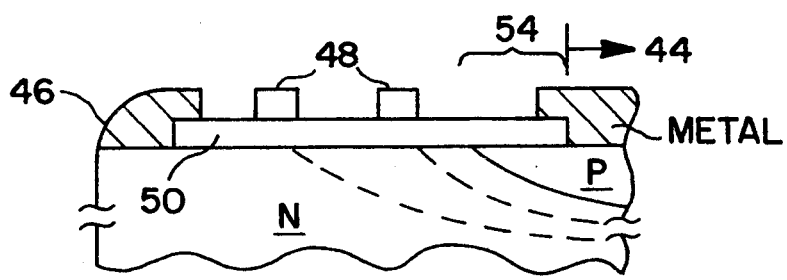

In a further embodiment the P-N junction may be tapered as illustrated in FIG. 5d. The tapered junction 54 may be added by using a low concentration graded-density implant on the junction edge. Experimental results indicate that a tapered junction 54 provides results superior to that of the conductive field plate 52 discussed above.

As may be seen from an analysis of the figures, ribbon 48 carries current across the passivation region at an angle from radial. That is, in the prior art the path of the current flowed radially between the active area and the edge, while in the present invention it does not (although portions of the ribbon may extend radially where, for example, radial portions may be appropriate for connections). In general, the angle of the path of the current flow with respect to radial in the present invention depends on the number of spirals, but may be equal to or less than 90° and greater than about 45°.

In operation, the device of the present invention functions in manner similar to that of the prior art; that is, the equipotential lines in the body of the device are spread out to avoid crowding in the regions near the curved P-N junctions in the device. However, since the voltage is distributed uniformly along the entire length of the ribbon, the voltage difference between any two loops in the spiral where portions of the ribbon are radially overlapping will be approximately equal to the total voltage difference divided by the total number of loops. In effect, the structure of the present invention is a series of nearly equipotential loops in which the loops themselves are the voltage distribution network. The present invention may find application in devices in which the voltage to be distributed exceeds about 100 volts when the device is operating.

Figure 6:
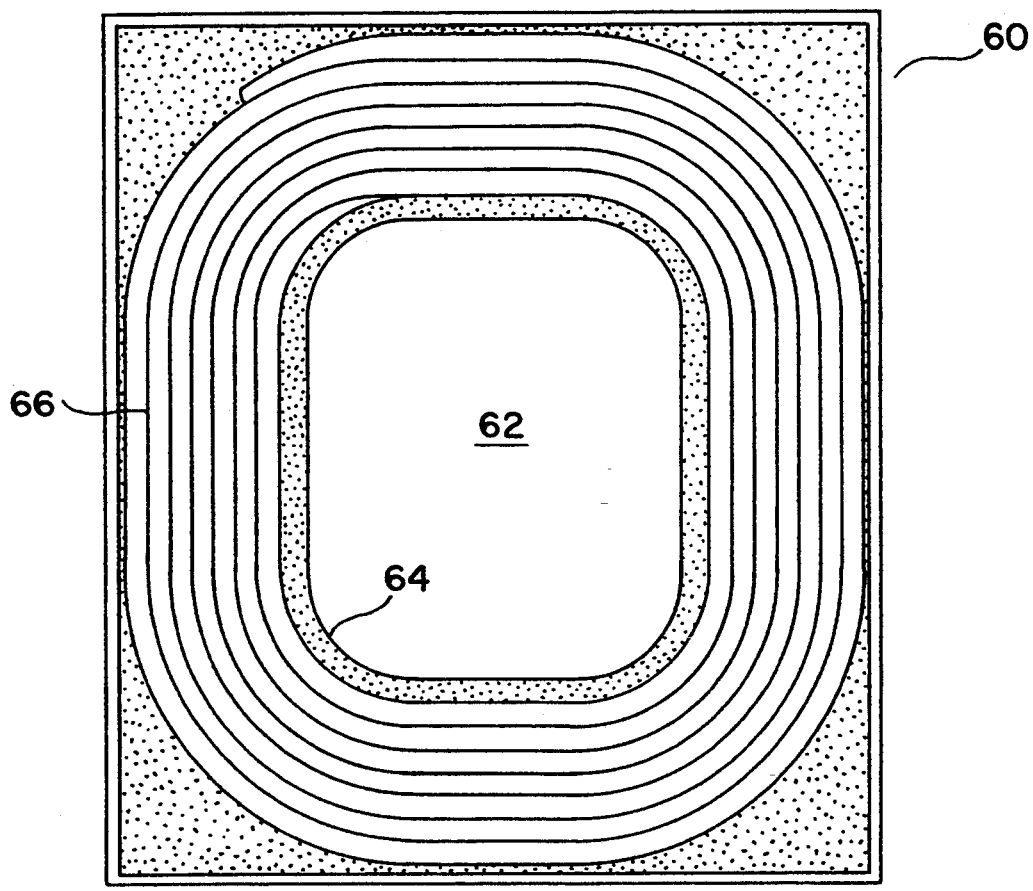
FIG. 6 is overhead plan view of a further embodiment of the present invention.

An exemplary application of the present invention may be seen in FIG. 6. FIG. 6 illustrates a 500 volt MOSFET 60 with die size approximately 4.5 millimeters square. The active area 62 of the device may be surrounded by a field plate 64 of resistive material from which extends a spiral ribbon 66 of deposited polysilicon. The field plate 64 may have a width of about 12 microns (assuming the junction depth is about 4 microns). The ribbon 66 spirals about the active area 62 ten times (only 6 loops are shown for clarity). As the voltage potential difference is about 500 volts and there are 10 loops, there is approximately a 50 volt loop-to-loop difference. The loops may be separated by approximately 5 microns, as 10 volts per micron is a reasonable value for a silicon edge passivation structure (other values may be suitable in other applications). The length of each loop will be approximately 16 millimeters so that the total length of the ribbon will be approximately 160 millimeters, or 160,000 microns which is equivalent to 32,000 squares (160,000 microns divided by 5 microns). As is known, polysilicon can be doped to have a sheet resistivity ranging from about 20 ohms per square to 10,000 ohms per square. With 32,000 squares in this embodiment, the ribbon could have a resistance anywhere from 640 kilohms to 320 megohms. If the resistance were 320 megohms, the leakage at 500 volts would be about 1.5 microamperes, a reasonable value for this type of device.

Figure 7:
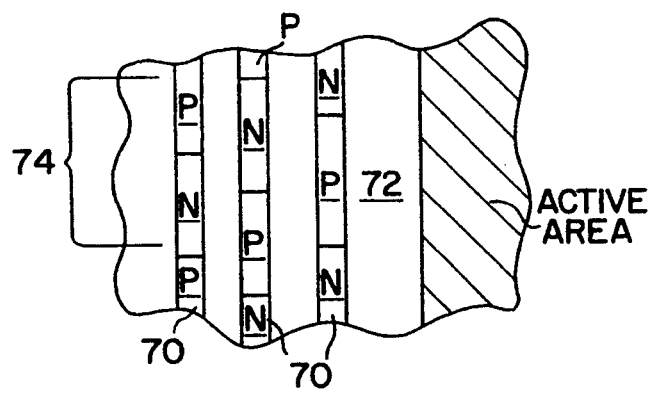
FIG. 7 is partial pictorial representation of a portion of the spiral edge passivation structure of the present invention illustrating the use of diodes in the ribbon.

With reference now to FIG. 7, in an alternative embodiment, a spiral ribbon 70 may be formed of polycrystalline silicon deposited on an insulative layer 72. The ribbon 70 may include sections having different semiconductor types so that a pair of adjacent sections forms a diode 74. Such a structure could produce even lower leakage current than the above-described linearly resistive ribbon 48. For example, if the diodes 74 are made by alternately doping polysilicon with N type and P type impurities, the diodes could have a forward breakdown voltage of about 6 volts each so as to obtain approximately 50 volts per loop, each loop having about 8 diodes. In the embodiment of FIG. 7 each diode would have a length of about 2 millimeters.

As will be appreciated, the spiral edge passivation structure of the present invention occupies less space on the surface of a semiconductor device than do the structures of the prior art because each loop of the spiral may have a width equal to the minimum capability of the photomask operation used in the fabrication of the device.

The reduction in an area over that of the prior art may be further increased in devices which block voltage in both directions rather than only one direction. As is known, an array of diffused rings with graded spacings is asymmetrical and can block voltage in only one direction. Therefore, in prior art devices that were required to block in both directions, the passivation structure sometimes included two independent arrays of diffused rings, one array located radially outward of the other and separated by a channel stopper region. One of the arrays was connected to block in one direction (e.g., forward blocking) and the other array was connected to block in the other direction (e.g., reverse blocking). In contrast, the spiral edge passivation structure of the present invention is symmetrical and can block voltage equally in either direction. As a result, the present invention can be used in edge passivation structures for devices that block in both directions, reducing the passivation area to less than half of that required for the diffused structures.

Figure 8A:
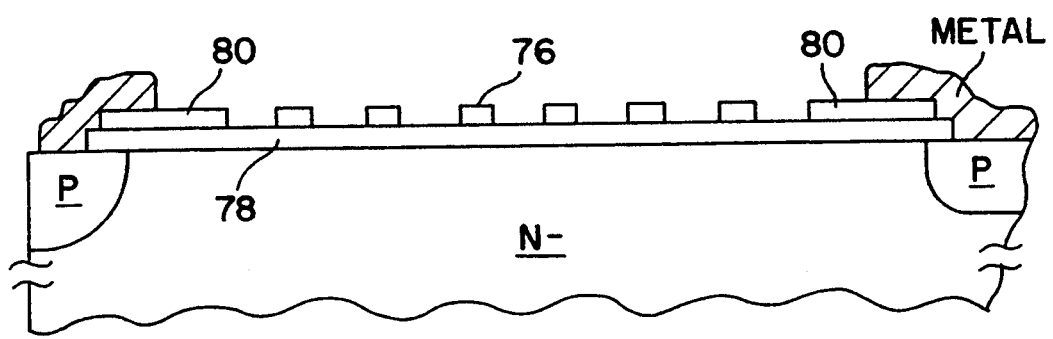
FIGS. 8a–8b are pictorial representations in vertical cross-section of bidirectional embodiments of the present invention.
Figure 8B:
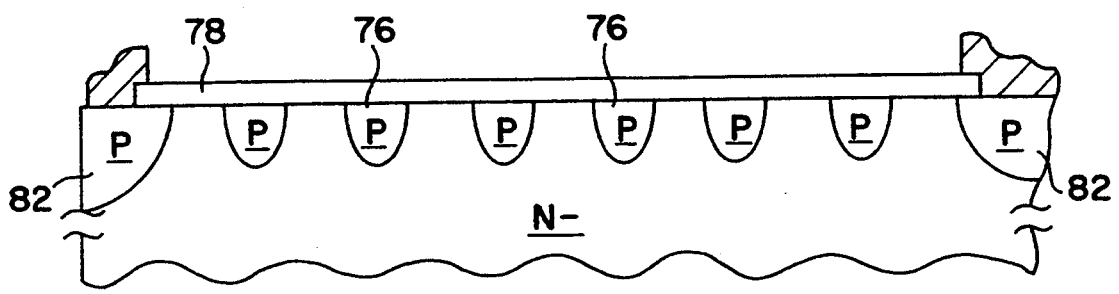

As may be seen in FIG. 8a, the spiral ribbon 76 may be formed on an insulative layer 78. In bidirectional devices, conductive field plates 80 may be added to each end of the spiral 76 so that the depletion region spreading out from one junction cannot reach completely across to the opposite junction. In effect, one of the field plates 80 becomes a reverse blocking field plate and a forward blocking channel stopper, while the other field plate 80 becomes a forward blocking field plate and reverse blocking channel stopper. Further, as seen in FIG. 8b, the spiral ribbon 76 may be formed in the body of the device and have the same conductivity type as the two opposing regions 82.

While the figures and the written description herein refer to specific arrangements of P and N types of semiconductor material and/or dopant, it will be appreciated by those skilled in the art that the opposite types of semiconductor material may be used as well. Further, while preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

I claim:

1. An edge passivation region for a semiconductor device comprising an electrically resistive ribbon that spirals around an active area of the device and has a cross-sectional area that varies as a function of distance from the active area.

2. A semiconductor device having an edge passivation region extending radially from an active area of the device to an edge terminal adjacent an edge of the device, the edge passivation region including spreading means for spreading a voltage difference between the active area and the edge terminal across the edge passivation region, said spreading means comprising an electrically resistive ribbon that conducts a current between the active area and the edge terminal at angles from the radial that are greater than about 45° and less than or equal to 90°, said ribbon having a cross-sectional area that varies as a function of distance from the active area.

3. An edge passivation region for a semiconductor device comprising an electrically resistive ribbon that spirals around an active area of the device and is connected to a band of electrically resistive material that surrounds the active area between the active area and said ribbon, said band having a width that is at least three times the depth of a curved P-N junction in the active area.

4. An edge passivation region for a semiconductor device comprising an electrically resistive ribbon that spirals around an active area of the device and comprises a plurality of serially connected semiconductor junction devices.

5. The device of claim 4 wherein one end of said ribbon electrically contacts a portion of the active area having a different electrical potential than an edge portion of the device when the device is operating and wherein the other end of said ribbon electrically contacts said edge portion so that the electric potential difference is spread along the length of said ribbon.

6. The device in claim 5 wherein the distance between radially overlapping portions of said ribbon and the cross-sectional area of said ribbon are related to the electric potential difference between the active area and the edge portion.

7. The device of claim 4 wherein said semiconductor junction devices comprise adjacent sections of semiconductor material having opposite semiconductor types, each pair of said adjacent sections forming a diode.

8. The device of claim 4 further comprising a band of electrically resistive material that surrounds the active area between said active area and said ribbon.

9. The device of claim 8 wherein said band has a width that exceeds the depth of a curved P-N junction in said active area.

10. The device of claim 9 wherein said width is at least three times the depth of said junction.

11. The device of claim 4 wherein the circumferential length of said ribbon in polar coordinates exceeds 360°.

12. The device in claim 4 wherein the distance between radially overlapping portions of said ribbon is uniform.

13. The device in claim 4 wherein the distance between radially overlapping portions of said ribbon is not uniform.

14. The device in claim 4 wherein said ribbon has a uniform cross-sectional area.

15. The device in claim 4 wherein said ribbon has a cross-sectional area that varies as a function of distance from the active area.

16. In a semiconductor device of a type having a semiconductor active region and a semiconductor passivation region surrounding the active region, wherein at least one semiconductor junction is formed between the active region and the passivation region, a circuit for increasing the breakdown voltage of the device comprising an electrical conductive path of serially connected semiconductor junction devices located within the passivation region formed of a plurality of series connected loops surrounding the active region, and means for electrically connecting the electrical conductive path between the active region and a portion of the passivation region.

17. The device of claim 16 wherein said plurality of serially connected semiconductor junction devices comprise diodes.

18. The device of claim 16 wherein the device, when energized, emanates an electrical field into the passivation region at said at least one semiconductor junction, and wherein the electrical conductive path functions to spread the electrical field lines to thereby increase the break down voltage of the device.

19. The device of claim 16 wherein the electrical connecting means connects a portion of the active region that forms said at least one semiconductor junction to the opposite edge of the passivation region.

20. A semiconductor device including a structure for preventing breakdown across a semiconductor junction comprising:
a first semiconductor region of a first type surrounding a second region, a portion of which includes a semiconductor of a second type so as to form at least one semiconductor junction therebetween;
contact means connected to at least a portion of the first semiconductor region apart from the second region, and
spiral configuration of serially connected semiconductor junction devices formed within the first region, surrounding the second region and extending away from said at least one semiconductor junction, connected at one end to the contact means and at the other end to the second region.

21. A semiconductor device having a curved P-N junction in an active area of the device that effects the breakdown voltage of the device, and an edge passivation region extending radially from the active area to an edge terminal adjacent an edge of the device, the edge passivation region including spreading means for spreading a voltage difference between the active area and the edge terminal across the edge passivation region to reduce the effect of the curved P-N junction on the breakdown voltage, said spreading means comprising an electrically resistive ribbon of diodes that spirals outwardly from the active area to the edge terminal so that the voltage difference between the active area and the edge terminal is spread along the length of said ribbon.

22. The device of claim 21 wherein said ribbon is formed in a body of the semiconductor device.

23. The device of claim 21 wherein said ribbon is deposited on a surface of the semiconductor device.

24. The device of claim 23 wherein said ribbon comprises adjacent sections having opposite semiconductor types, each pair of said adjacent sections forming one of said diodes.

25. The device in claim 21 wherein the distance between radially overlapping portions of said ribbon and the cross-sectional area of said ribbon are related to the voltage difference between the active area and the edge terminal.

26. The device of claim 21 further comprising a band of electrically resistive material that surrounds the active area between said active area and said ribbon.

27. The device of claim 26 wherein said band has a width that exceeds the depth of said P-N junction.

28. The device of claim 21 wherein said voltage difference exceeds about 100 volts when said device is operating.

29. The device of claim 21 wherein the circumferential length of said ribbon exceeds 360°.

* * * * *